(12) United States Patent
Peng et al.

(10) Patent No.: US 12,112,974 B2
(45) Date of Patent: Oct. 8, 2024

(54) INTEGRATED CIRCUIT ISOLATION FEATURE AND METHOD OF FORMING THE SAME

(71) Applicant: Taiwan Semiconductor Manufacturing Co., Ltd., Hsinchu (TW)

(72) Inventors: Chih-Tang Peng, Hsinchu County (TW); Shuen-Shin Liang, Hsinchu (TW); Keng-Chu Lin, Ping-Tung (TW); Teng-Chun Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/860,264

(22) Filed: Jul. 8, 2022

(65) Prior Publication Data
US 2022/0344199 A1    Oct. 27, 2022

Related U.S. Application Data

(62) Division of application No. 16/362,965, filed on Mar. 25, 2019, now Pat. No. 11,387,138.

(60) Provisional application No. 62/736,127, filed on Sep. 25, 2018.

(51) Int. Cl.
| | |
|---|---|
| *H01L 21/762* | (2006.01) |
| *H01L 21/02* | (2006.01) |
| *H01L 21/768* | (2006.01) |
| *H01L 21/8234* | (2006.01) |

(52) U.S. Cl.
CPC .. *H01L 21/76224* (2013.01); *H01L 21/02164* (2013.01); *H01L 21/02356* (2013.01); *H01L 21/76826* (2013.01); *H01L 21/76837* (2013.01); *H01L 21/823481* (2013.01)

(58) Field of Classification Search
None
See application file for complete search history.

(56) References Cited

U.S. PATENT DOCUMENTS

| | | |
|---|---|---|
| 7,915,139 B1 | 3/2011 | Lang et al. |
| 9,425,318 B1* | 8/2016 | Hoentschel ......... H01L 29/7843 |
| 2009/0004839 A1* | 1/2009 | Eun ................... H01L 21/02304 |
| | | 257/E21.507 |
| 2011/0034035 A1 | 2/2011 | Liang |
| 2011/0034039 A1 | 2/2011 | Liang et al. |
| 2011/0151678 A1 | 6/2011 | Ashtiani |
| 2014/0045325 A1 | 2/2014 | Eun |

(Continued)

*Primary Examiner* — Nilufa Rahim
(74) *Attorney, Agent, or Firm* — HAYNES AND BOONE, LLP

(57) ABSTRACT

Examples of a technique for forming a dielectric material for an integrated circuit are provided herein. In an example, an integrated circuit workpiece is received that includes a recess. A first dielectric precursor is deposited in the recess. The first dielectric precursor includes a non-semiconductor component. A second dielectric precursor is deposited in the recess on the first dielectric precursor, and an annealing process is performed such that a portion of the non-semiconductor component of the first dielectric precursor diffuses into the second dielectric precursor. The non-semiconductor component may include oxygen, and the annealing process may be performed in one of a vacuum or an inert gas environment.

20 Claims, 12 Drawing Sheets

(56) References Cited

U.S. PATENT DOCUMENTS

| | | |
|---|---|---|
| 2015/0001643 A1 | 1/2015 | Kim |
| 2015/0171085 A1 | 6/2015 | Fumitake |
| 2015/0287611 A1 | 10/2015 | Zhao |
| 2016/0013051 A1 | 1/2016 | Zeng |
| 2017/0018452 A1 | 1/2017 | Dou et al. |
| 2018/0323110 A1* | 11/2018 | Bu .................... H01L 21/31111 |
| 2020/0211838 A1* | 7/2020 | Muramatsu ........... H01L 21/768 |
| 2020/0365447 A1* | 11/2020 | Mays .................... C23C 16/045 |

* cited by examiner

INTEGRATED CIRCUIT ISOLATION FEATURE AND METHOD OF FORMING THE SAME

PRIORITY

This application is a divisional application of U.S. patent application Ser. No. 16/362,965, filed Mar. 25, 2019, which claims benefit of and is related to U.S. Provisional Application Ser. No. 62/736,127, filed Sep. 25, 2018, each of which is hereby incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, each iteration of size reduction presents greater challenges to both design and manufacturing. Through advances in these areas, increasingly complex designs are being fabricated with precision and reliability.

Many manufacturing steps form precise layers of materials one upon the other to create a circuit device. For example, many processes include depositing layers of dielectric material. Dielectric materials are generally insulators, and dielectric layers may be used to control the flow of current. The amount of insulation provided by a given thickness of a dielectric may depend on the physical characteristics of the dielectric material, such as the composition, uniformity, shape, etc. Furthermore, because of the workability of dielectric materials, they may be used to form a supporting framework, a mold, a cast, or a form for another feature. Like the insulation example, the suitability of a dielectric layer for structural purposes may depend on the physical characteristics of the dielectric material, such as the composition, uniformity, shape, thickness, adhesion, etc. In these examples and others, the ability to precisely form these layers determines whether or not the resulting circuit meets the design specification and determines whether it even operates at all.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
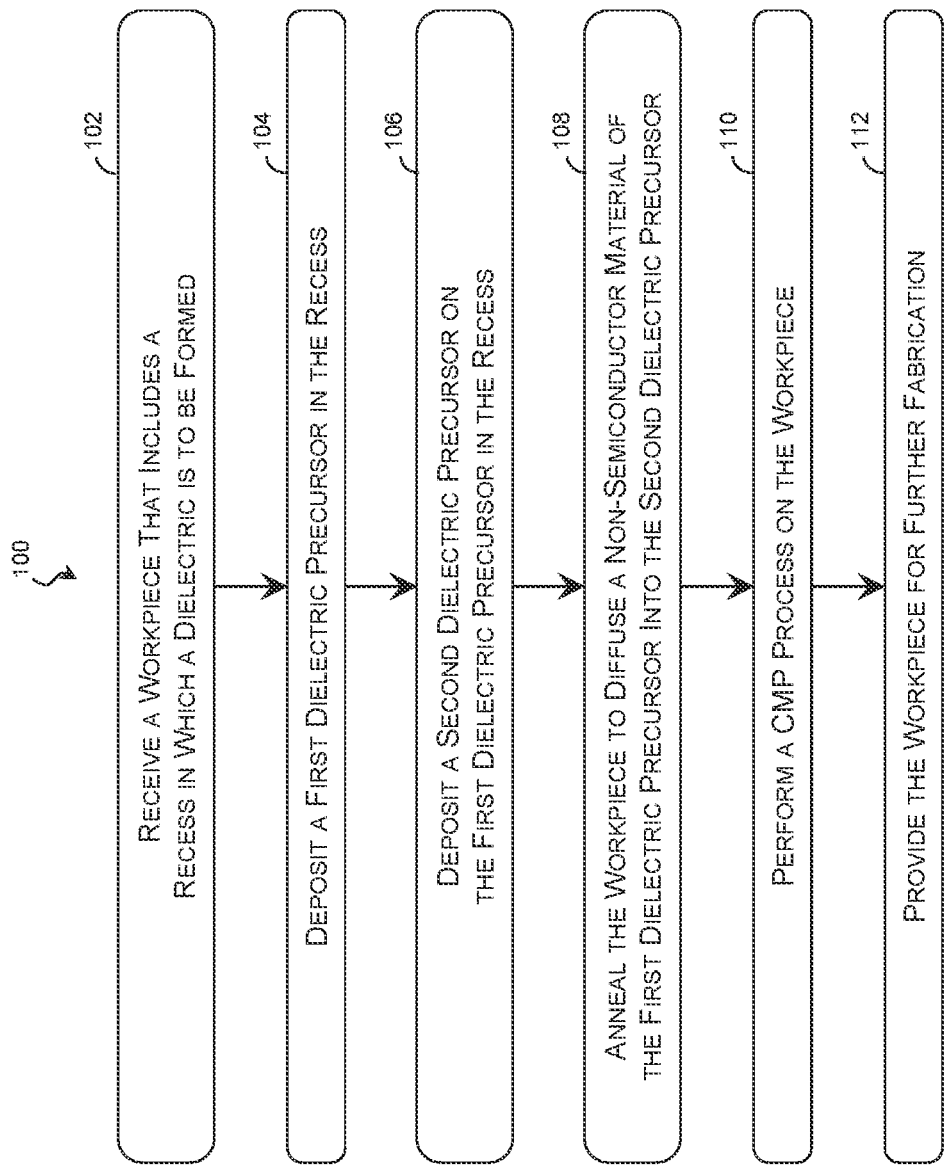
FIG. 1 is a flow diagram of a method of forming a dielectric material on a workpiece according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

Fabricating an integrated circuit may include forming any number of layers of various materials that make up circuit devices (such as Field Effect Transistors (FETs), Bipolar Junction Transistors (BJTs), resistors, capacitors, inductors, etc.) and the interconnections that electrically couple the devices. As improvements in fabrication drive device features closer together, new challenges may arise in forming layers within the increasingly narrow recesses between features.

For example, in some embodiments, Shallow Trench Isolation features (STIs) or other isolation features are formed by depositing a dielectric material within recesses between circuit devices. In that regard, circuits that include Fin-like Field Effect Transistors (FinFETs) may have particularly narrow recesses between devices. A FinFET is a type of three-dimensional transistor where the channel region and source/drain regions are fabricated on a thin "fin" (or fin structure) that extends out of a substrate and the gate wraps around the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. However, as reductions in feature size drive the fins closer together, it may become more difficult to deposit a uniform dielectric in the narrow space between the fins.

As another example, in some embodiments, an interconnect is formed by depositing layers of dielectric material on the circuit devices and forming conductive features within the dielectric material. The lowest layers of the interconnect dielectric may extend into recesses between protruding features of the circuit devices such as gates and/or source/drain features. However, as the distance between these features is reduced, it may become increasingly difficult to form a uniform layer of dielectric between the device features.

To address these concerns and others, the present disclosure provides a technique for forming a dielectric material within a recess that provides improved uniformity. Thus, in some embodiments where the dielectric material includes a semiconductor component (e.g., Si, SiGe, etc.) and a non-semiconductor component (e.g., oxygen, nitrogen, carbon, etc.), the ratio of the semiconductor component to the non-semiconductor component is more uniform throughout the layer. In some embodiments, this is achieved without the use of techniques, such as steam annealing, that may compromise the surrounding structures. In particular, steam annealing has been found to inadvertently oxidize the remainder of the workpiece, and so the use of steam annealing may be limited to a "steam budget." By depositing a uniform dielectric material without the use of steam annealing, in some embodiments, the present technique keeps the workpiece within the steam budget or even avoids steam annealing altogether. Of course, these benefits are merely examples and are not required for any particular embodiment.

The present disclosure provides examples of a technique of fabricating an integrated circuit that includes depositing a dielectric material within recesses. The technique is equally suitable for depositing the dielectric material within many different types of recesses and is not limited to any particular type of recess. Accordingly, the technique may be used to form isolation features, Inter-Level Dielectric layers (ILDs), and/or other circuit features. FIG. 1 is a flow diagram of a method 100 of forming a dielectric material on a workpiece according to various aspects of the present disclosure. Additional steps can be provided before, during, and after the method 100, and some of the steps described can be replaced or eliminated for other embodiments of the method 100. The method 100 is first described in the context of forming an STI and subsequently described in the context of forming an ILD.

In that regard, FIGS. 2-7 are cross-sectional diagrams of a workpiece 200 taken along a fin width direction at points in the method 100 of fabrication according to various aspects of the present disclosure. FIGS. 2-7 have been simplified for the sake of clarity and to better illustrate the concepts of the present disclosure. Additional features may be incorporated into the workpiece 200, and some of the features described below may be replaced or eliminated for other embodiments of the workpiece 200.

Figure 2:
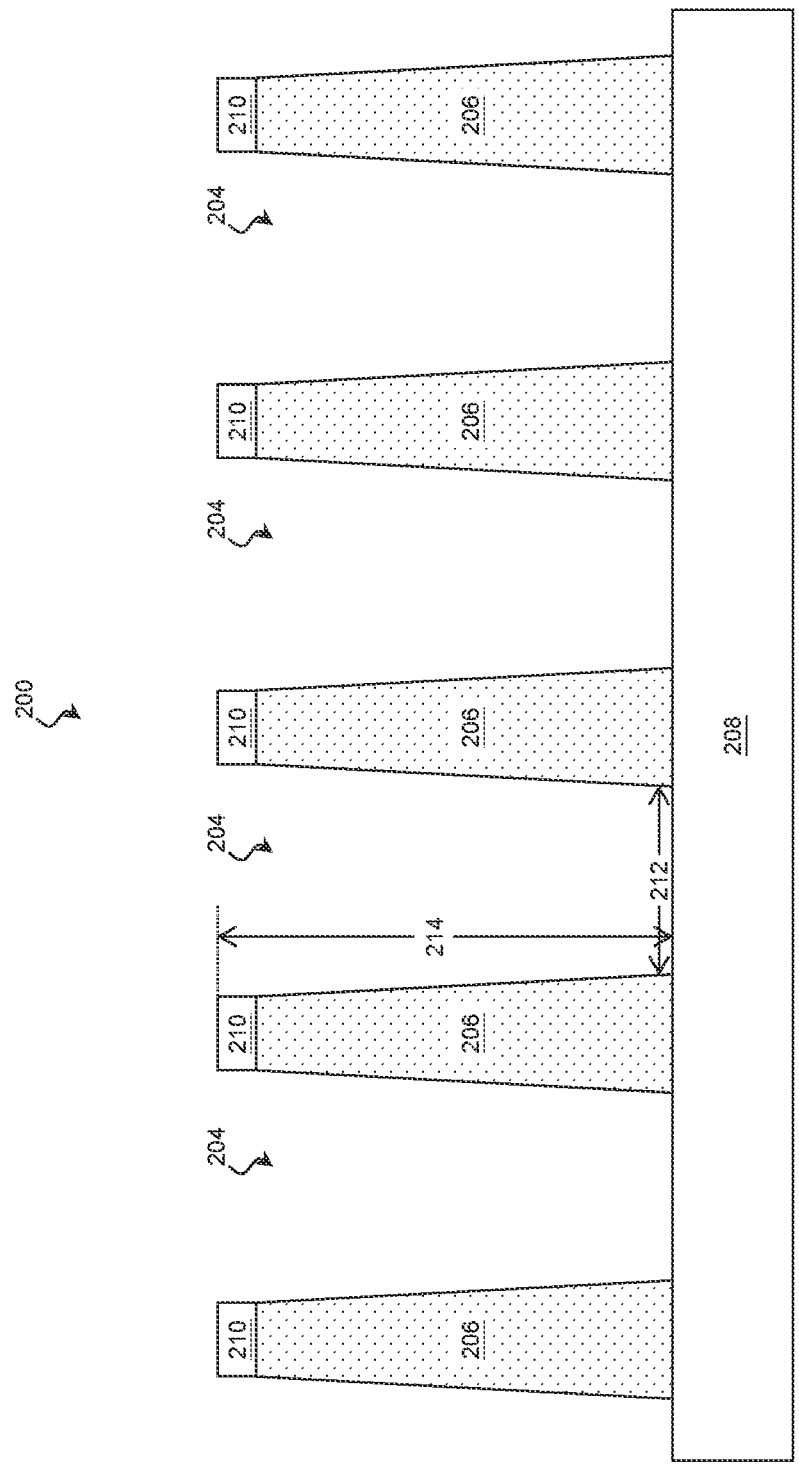
FIGS. 2-7 are cross-sectional diagrams of a workpiece taken along a fin width direction at points in a method of fabrication according to various aspects of the present disclosure.

Referring first to block 102 of FIG. 1 and to FIG. 2, the workpiece 200 is received. The workpiece 200 includes a recess 204 in which a dielectric material is to be deposited. In some embodiments, the recess 204 is between device fins 206 that extend from a substrate 208.

In more detail, the workpiece 200 includes a substrate 208 upon which devices are to be formed. In various examples, the substrate 208 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 208 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 208. In some such examples, a layer of the substrate 208 may include an insulator such as a semiconductor oxide, a semiconductor nitride, a semiconductor oxynitride, a semiconductor carbide, and/or other suitable insulator materials.

Doped regions, such as wells, may be formed on the substrate 208. In that regard, some portions of the substrate 208 may be doped with p-type dopants, such as boron, $BF_2$, or indium while other portions of the substrate 208 may be doped with n-type dopants, such as phosphorus or arsenic; and/or other suitable dopants including combinations thereof.

In some embodiments, the devices to be formed on the substrate 208 extend out of the substrate 208. For example, FinFETs and/or other non-planar devices may be formed on device fins 206 disposed on the substrate 208. The device fins 206 are representative of any raised feature and include FinFET device fins 206 as well as fins 206 for forming other raised active and passive devices upon the substrate 208. The fins 206 may be similar in composition to the substrate 208 or may be different therefrom. For example, in some embodiments, the substrate 208 may include primarily silicon, while the fins 206 include one or more layers that are primarily germanium or a SiGe semiconductor. In some embodiments, the substrate 208 includes a SiGe semiconductor, and the fins 206 include one or more layers that include a SiGe semiconductor with a different ratio of silicon to germanium.

The fins 206 may be formed by etching portions of the substrate 208, by depositing various layers on the substrate 208 and etching the layers, and/or by other suitable techniques. For example, the fins 206 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 208 and patterned using a photolithography process. Spacers 210 of dielectric material are formed alongside the patterned sacrificial layer using a self-aligned process. The sacrificial layer is then removed, and the remaining spacers 210 may then be used to pattern the fins.

The recesses 204 between the fins 206 may be relatively tall and narrow. In various examples, the bottom of a recess 204 has a width 212 of between about 30 nm and about 80 nm and a depth 214 of between 120 nm and 210 nm with an aspect ratio (i.e., a ratio of height to width) of between 7:1 and 3:2. Thus, the recesses 204 may have a relatively high aspect ratio, which may contribute to irregularities in a dielectric layer formed within the recesses 204. For example, diffusion-based processes that rely on diffusion to introduce a non-semiconductor material from the top surface of the dielectric may be unable to coax the non-semiconductor material into the bottom of the recesses 204. In many examples, the method 100 overcomes these limitations in order to form a dielectric layer with a uniform composition in high-aspect ratio recesses 204.

Figure 3:
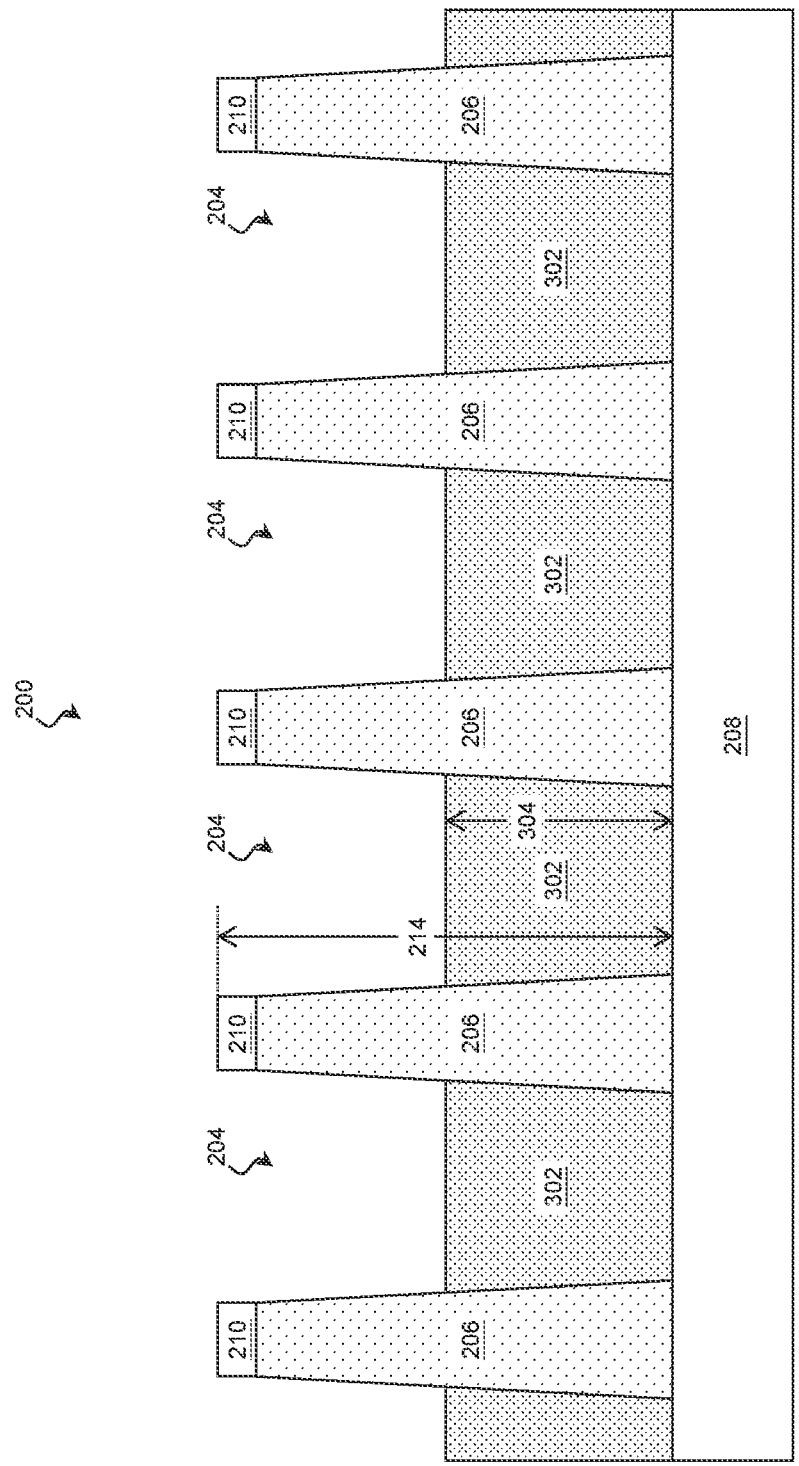

Referring to block 104 of FIG. 1 and to FIG. 3, a first dielectric precursor 302 is deposited on the workpiece 200 in the recess 204. The first dielectric precursor 302 may interact with a subsequently formed precursor layer to form a dielectric material (e.g., a semiconductor oxide, a semiconductor nitride, a semiconductor oxynitride, etc.). Accordingly, the first dielectric precursor 302 may include one or more semiconductor components (e.g., silicon, germanium, SiGe, silicon carbide, gallium arsenic, gallium phosphide, indium phosphide, indium arsenide, indium antimonide, GaAsP, AlInAs, AlGaAs, GaInAs, GaInP, GaInAsP, etc.) and one or more non-semiconductor components (e.g., oxygen, nitrogen, carbon, etc.).

The first dielectric precursor 302 may act as a diffusion source for the non-semiconductor component(s), and may have relatively more of the non-semiconductor components than the subsequently formed precursor layers. In one such embodiment, the first dielectric precursor 302 includes silicon and oxygen, and the ratio of oxygen to silicon in the first dielectric precursor 302 is at least 2:1.

The first dielectric precursor 302 may be formed using any suitable process including Chemical Vapor Deposition (CVD), Flowable CVD (FCVD), High-Density Plasma CVD (HDP-CVD), Physical Vapor Deposition (PVD), spin-on deposition, and/or other suitable deposition processes. In some examples, the first dielectric precursor 302 is formed by an FCVD process that includes depositing tetramethyl orthosilicate (TMOS) in a liquid form within the recesses 204 at a temperature between about 50° C. and about 100° C. while supplying $O_3$ and/or another oxygen-radical source to the workpiece 200. The FCVD process may be followed by a curing technique, such as thermal annealing and/or an ultraviolet radiation treatment, to convert the flowable material of the first dielectric precursor 302 into a solid material. In one such example, the curing includes an ozone soak process where the first dielectric precursor 302 is exposed to $O_3$ and/or another oxygen-radical source during curing.

The first dielectric precursor 302 may be formed to any suitable depth 304 within the recesses 204. In some examples where the depth 214 of the recesses 204 is about 80 nm, the first dielectric precursor 302 is formed to a depth 304 of about 40 nm, or about half the depth 214 of the recesses 204. In further examples where the recesses 204 are to be filled using more than two precursor layers, the depth of the first dielectric precursor 302 may be significantly less than half of the depth 214 of the recesses 204 (e.g., about ¼, about ⅛, etc.).

In order to achieve a particular depth 304, in some embodiments, the first dielectric precursor 302 is deposited so that it overfills the recesses 204 and is then etched back to the specified depth 304. The etching process may include a wet etching, a dry etching, and/or other suitable etching technique configured to etch the first dielectric precursor 302 without significantly etching the surrounding materials such as the device fins 206 and/or the substrate 208.

Figure 4:
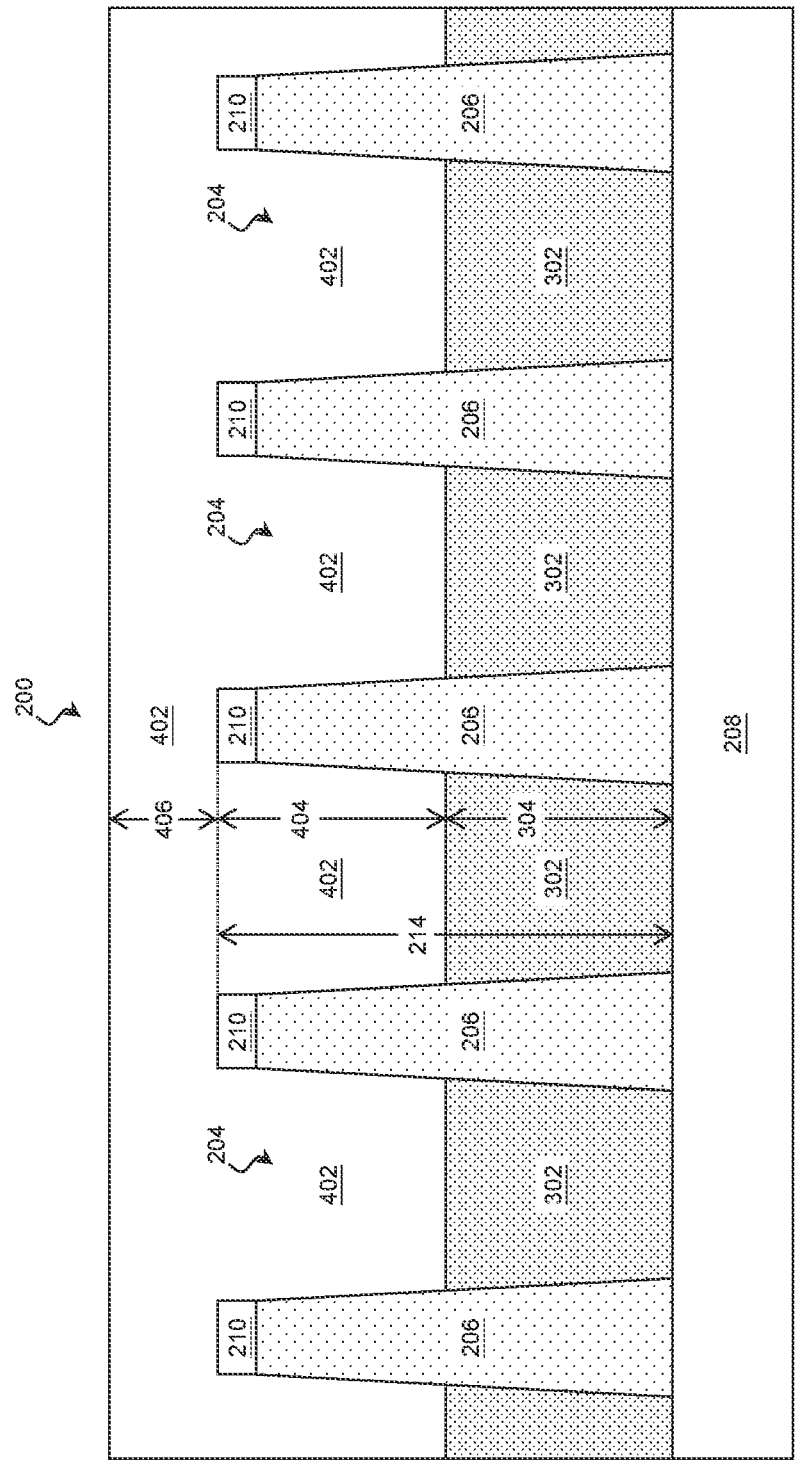

Referring to block 106 of FIG. 1 and to FIG. 4, a second dielectric precursor 402 is deposited on the workpiece 200 in the recess 204. The second dielectric precursor 402 may include the same semiconductor component(s) and non-semiconductor component(s) as the first dielectric precursor 302. However, the second dielectric precursor 402 may acquire some of the non-semiconductor components from the first dielectric precursor 302 in a subsequent process, and so at deposition, the second dielectric precursor 402 may have less of the non-semiconductor components than the first dielectric precursor 302. In other words, the second dielectric precursor 402 may be semiconductor-rich compared to the first dielectric precursor 302. In one such embodiment, the first dielectric precursor 302 includes silicon and oxygen with a ratio of oxygen to silicon of at least 2:1 at deposition, while the second dielectric precursor 402 includes silicon and oxygen with a ratio of oxygen to silicon of less than 2:1 at deposition. Furthermore, the second dielectric precursor 402 may be completely free of the non-semiconductor component(s) of the first dielectric precursor 302. In one such embodiment, the first dielectric precursor 302 includes silicon and oxygen with a ratio of oxygen to silicon of at least 2:1 at deposition, while the second dielectric precursor 402 is substantially free of oxygen and instead includes silicon and nitrogen with a ratio of nitrogen to silicon of less than 4:3 at deposition.

The second dielectric precursor 402 may be formed using any suitable process including CVD, FCVD, HDP-CVD, PVD, spin-on deposition, and/or other suitable deposition processes. In some examples, the second dielectric precursor 402 is formed by an FCVD process that includes depositing trisilylamine (TSA) at a temperature between about 30° C. and about 120° C. while supplying an oxygen-radical source (e.g., $O_3$), $NH_3$, and/or $H_2$ to the workpiece 200. The FCVD process may be followed by a curing technique, such as thermal annealing and/or an ultraviolet radiation treatment, to convert the flowable material of the second dielectric precursor 402 into a solid material. In one such example, the curing includes an ozone soak process where the second dielectric precursor 402 is exposed to $O_3$ and/or another oxygen-radical source during curing.

The second dielectric precursor 402 may be formed to any suitable depth 404 within the recesses 204 and may extend above the recesses to any suitable height 406. In some examples where the depth 214 of the recesses 204 is between about 120 nm and about 210 nm, the second dielectric precursor 402 is formed to a depth 404 between about 60 nm and about 105 nm, or about half the depth 214 of the recesses 204. In further examples where the recesses 204 are to be filled using more than two precursor layers, the depth of the second dielectric precursor 402 may be significantly less than half of the depth 214 of the recesses 204 (e.g., about ¼, about ⅛, etc.). Accordingly, blocks 104 and 106 may be repeated any number of times in order to fill the recesses 204 with alternating layers of the first dielectric precursor 302 and the second dielectric precursor 402.

Figure 5:
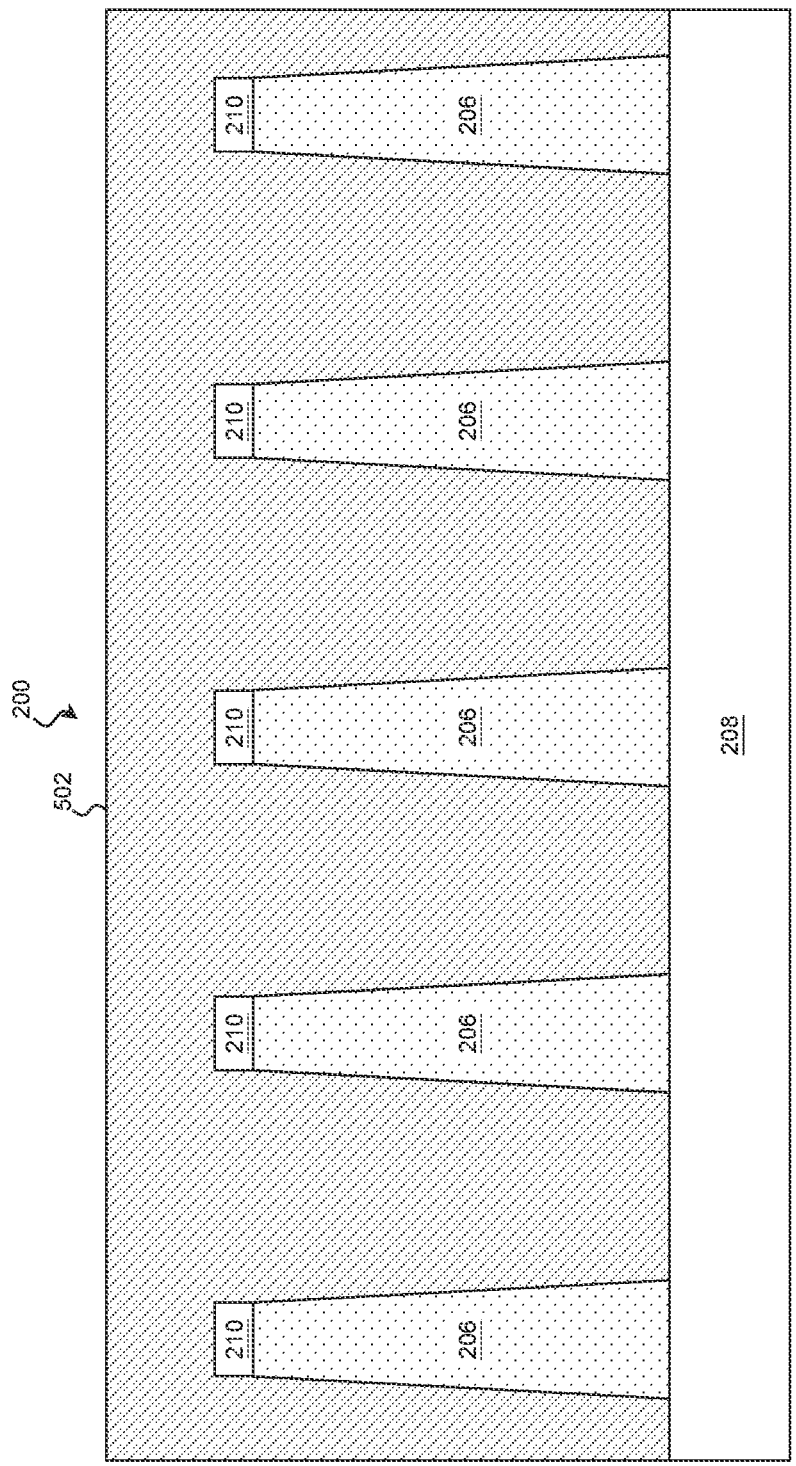

Referring to block 108 of FIG. 1 and to FIG. 5, an annealing process is performed on the workpiece 200. The annealing process causes some of at least one of the non-semiconductor materials of the first dielectric precursor 302 to diffuse or migrate from the first dielectric precursor 302 into the second dielectric precursor 402. In this way, the annealing process forms a dielectric layer 502 from the first dielectric precursor 302 and the second dielectric precursor 402 that includes a substantially uniform distribution of the semiconductor material(s) and the non-semiconductor material(s) of the precursors. In particular, because the diffusing non-semiconductor material migrates from the bottom of the recesses 204 to the top, the concentration of this material at the bottom of the recess is significantly more uniform than techniques that introduce the non-semiconductor material from the top of the dielectric layer 502 during annealing. Furthermore, in many examples, the annealing is performed in a vacuum or using only inert ambient gasses, which may avoid unintended reactions between the ambient gasses and portions of the workpiece such as the device fins 206 and/or the substrate 208.

The annealing process may utilize any suitable technique, such as Rapid Thermal Annealing (RTA) and/or laser annealing, and may be performed at any suitable temperature for any suitable duration. In some examples, the annealing includes heating the workpiece 200 to a temperature greater than 600° C. for duration between about 1 hour and about 24 hours in a vacuum or in an inert gas environment.

In this way, the technique provides greater uniformity of the concentrations of the semiconductor and non-semiconductor materials throughout the dielectric layer 502. In some examples, where each of the first dielectric precursor 302 and the second dielectric precursor 402 includes silicon and oxygen, the portion of the resulting dielectric layer 502 within the recess 204 has an oxygen to silicon ratio that varies less than about 5% throughout the dielectric layer 502. Furthermore, in contrast to other techniques, the concentration of oxygen may be greatest at the bottom of the recesses 204 and less at the top of the recesses 204.

Figure 6:
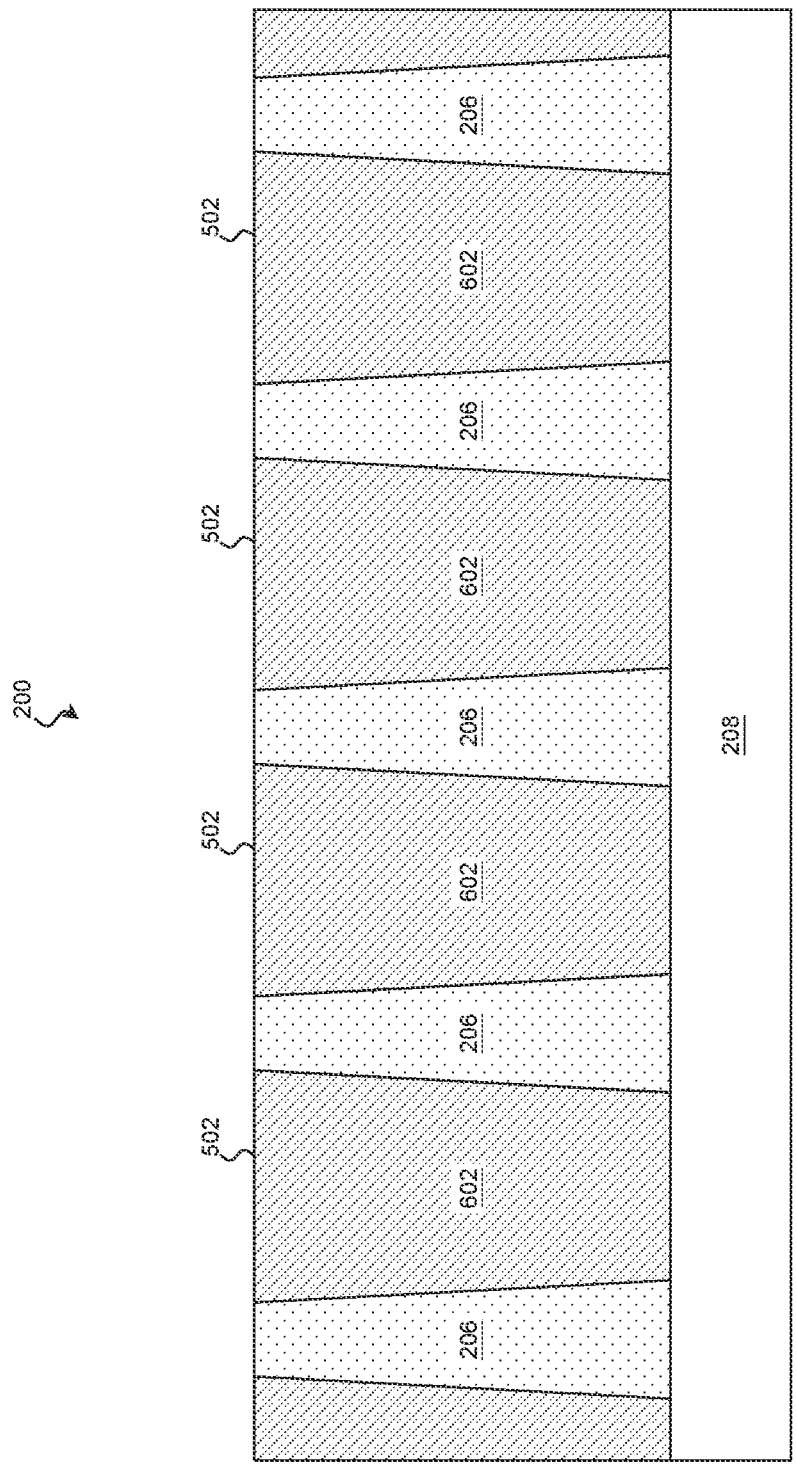

Referring to block 110 of FIG. 1 and to FIG. 6, a Chemical Mechanical Planarization/Polish (CMP) process is performed on the workpiece 200 to remove the portions of the dielectric layer 502 that extend above the device fins 206. The remaining portions of the dielectric layer 502 form isolation features 602 that may electrically isolate the circuit devices of the workpiece 200. The CMP process may also remove the remaining spacers 210 from the top of the device fins 206.

Figure 7:
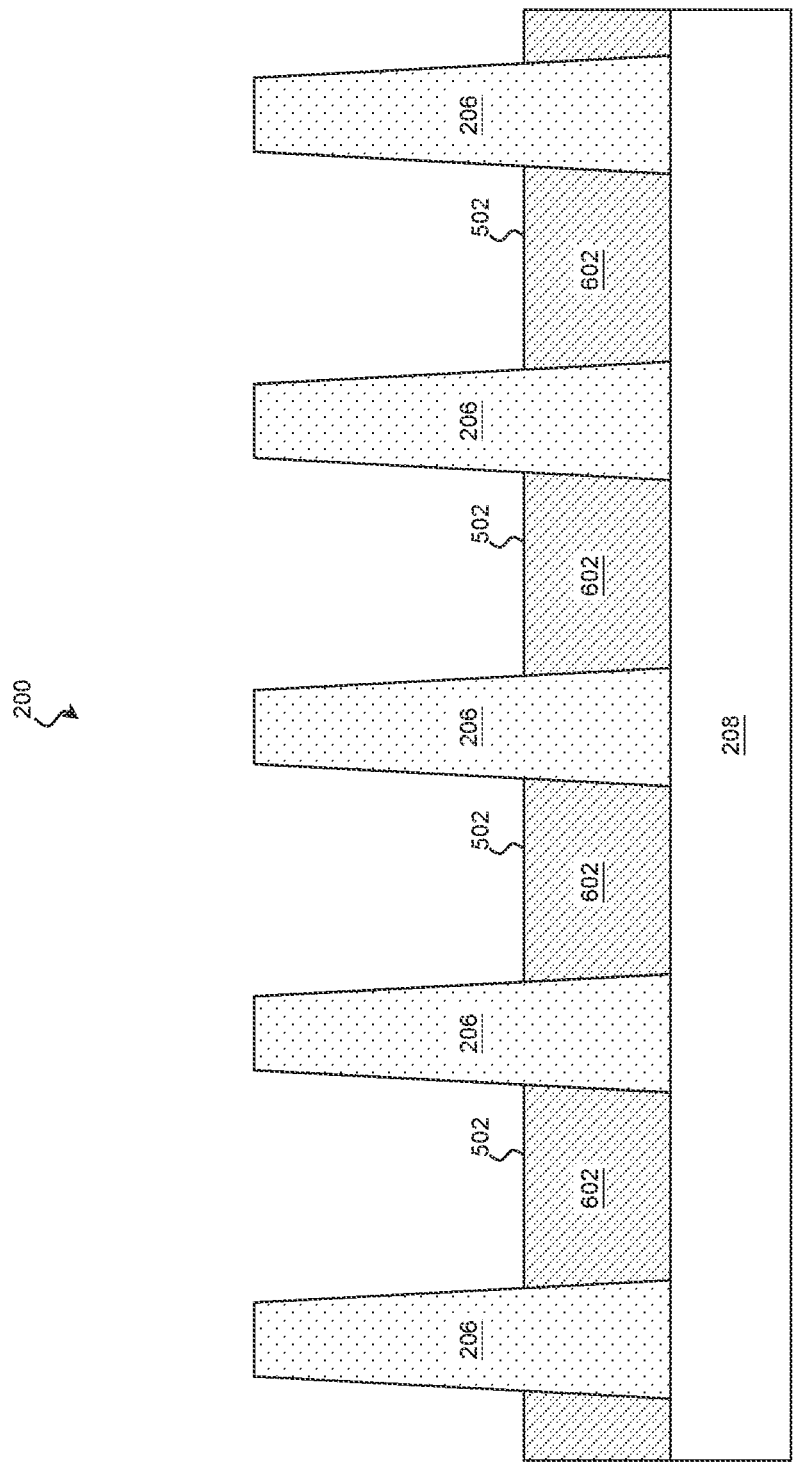

Referring to FIG. 7, the dielectric layer 502 of the isolation features 602 may be recessed so that portions of the device fins 206 extend above the isolation features 602 for forming FinFETs and/or other circuit devices on the fins 206. Recessing the dielectric layer 502 may include wet etching, dry etching, Reactive Ion Etching (RIE), and/or other suitable etching processes configured to etch the dielectric layer 502 without substantial etching of the surrounding materials such as the device fins 206.

Referring to block 112 of FIG. 1, the workpiece 200 is provided for further fabrication. In various examples this includes: forming placeholder or dummy gates over channel regions of the fins 206, forming gate spacers on sides of the placeholder gates, epitaxially growing source/drain features, forming an ILD layer on the workpiece, performing a gate replacement process to replace the placeholder gates with functional gates, forming a remainder of an electrical interconnect structure, dicing, packaging, and/or other fabrication processes.

Further examples of the technique are described in the context of forming an ILD with reference to FIG. 1 and FIGS. 8-12. In that regard, FIGS. 8-12 are cross-sectional diagrams of a workpiece 800 taken along a fin length direction at points in the method 100 of fabrication according to various aspects of the present disclosure. FIGS. 8-12 have been simplified for the sake of clarity and to better illustrate the concepts of the present disclosure. Additional features may be incorporated into the workpiece 800, and some of the features described below may be replaced or eliminated for other embodiments of the workpiece 800.

Figure 8:
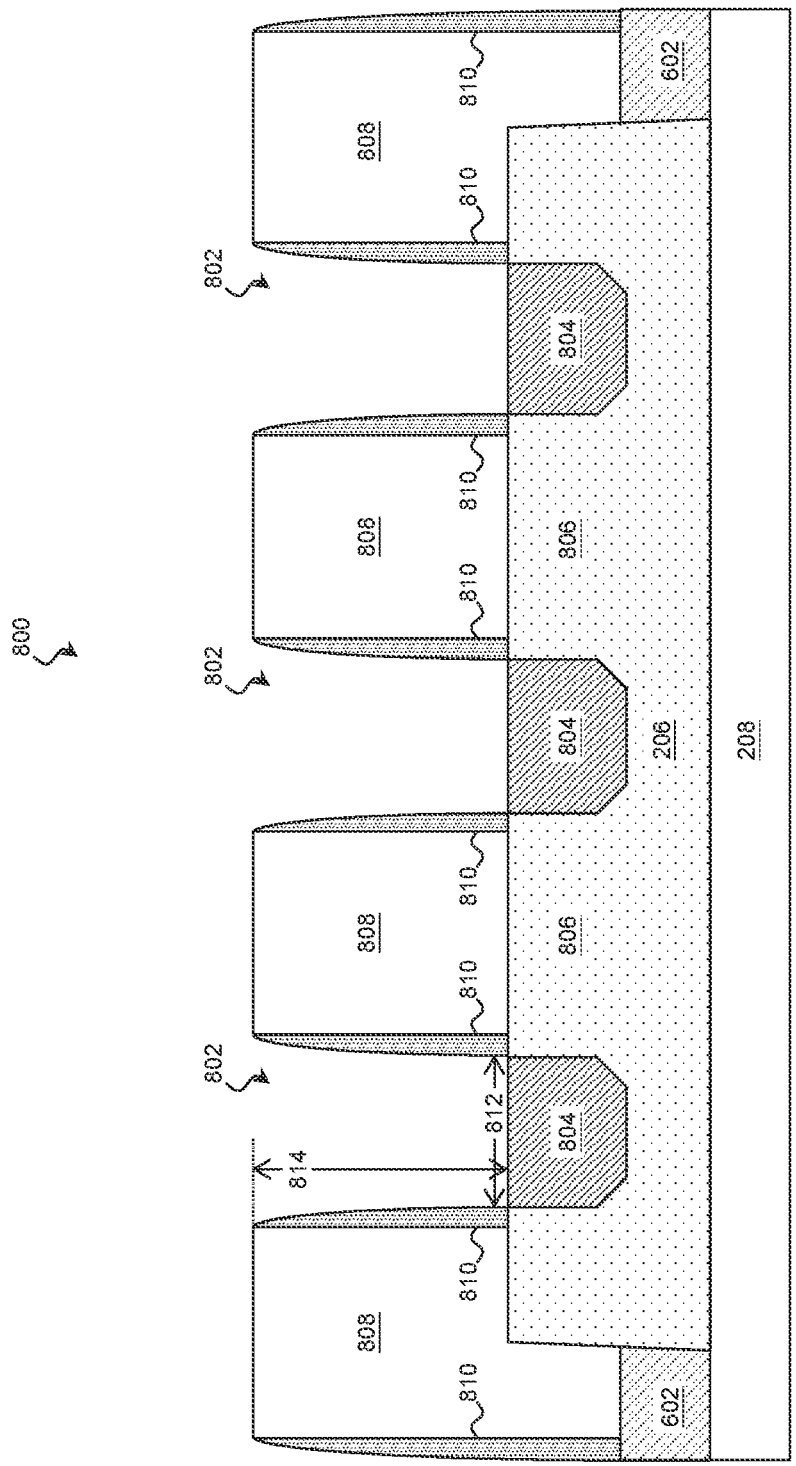
FIGS. 8-12 are cross-sectional diagrams of a workpiece taken along a fin length direction at points in a method of fabrication according to various aspects of the present disclosure.

Referring first to block 102 of FIG. 1 and to FIG. 8, the workpiece 800 is received. The workpiece 800 may be substantially similar to or the same as workpiece 200 above and may include a substrate 208, device fins 206 extending from the substrate 208, and isolation features 602 disposed between the fins 206, each substantially as described above. The workpiece 800 may be formed by any suitable method, including method 100. The workpiece 800 includes a recess 802 in which a dielectric material is to be deposited. In some examples, the recess 802 is between features (e.g., gate structures) of circuit devices formed on the workpiece 800.

The circuit devices may be formed on the device fins 206 in the case of FinFETs or directly on the substrate 208 itself in the case of planar devices. An exemplary circuit device includes a pair source/drain features 804 disposed on opposite sides of a channel region 806. The source/drain features 804 and channel region 806 may include a semiconductor material and one or more dopants. Suitable p-type dopants include boron, $BF_2$, and combinations thereof, and suitable n-type dopants include phosphorus, arsenic, and combinations thereof. With respect to the particular dopant type, the source/drain features 804 are doped to be of opposite type than the remainder of the fins 206. For a p-channel device, the fin 206 is doped with an n-type dopant and the source/drain features 804 are doped with a p-type dopant, and vice versa for an n-channel device.

The exemplary circuit device further includes a gate structure 808 formed over the channel region 806. In some examples, the gate structure 808 is a functional gate structure. However, when materials of the functional gate structure are sensitive to fabrication processes or are difficult to pattern, a placeholder gate of polysilicon, dielectric, and/or other resilient material, may be used during some of the fabrication processes. The placeholder gate is later removed and replaced with elements of a functional gate (e.g., a gate electrode, a gate dielectric layer, an interfacial layer, etc.) in a gate-last process. In such examples, the gate structure 808 represents a placeholder gate.

In some embodiments, the device includes sidewall spacers 810 formed on the vertical surfaces of the gate structure 808. The sidewall spacers 810 may comprise layers of any suitable dielectric material, such as a semiconductor oxide, a semiconductor nitride, a semiconductor oxynitride, a semiconductor carbide, other suitable materials, and/or combinations thereof.

An ILD is to be formed on the circuit devices of the workpiece 800 including in the recesses 802 between the gate structures 808 and/or sidewall spacers 810. Similar to the isolation feature examples above, the recesses 802 between the gate structures 808 and/or sidewall spacers 810 may be relatively tall and narrow. In an example, the bottom of a recess 802 may have a width 812 of between about 10 nm and about 50 nm and a depth 814 of between about 50 nm and about 100 nm with an aspect ratio (i.e., a ratio of height to width) of between 10:1 and 1:1. Thus, the recesses 802 may have a relatively high aspect ratio, which may contribute to irregularities in a dielectric layer formed within the recesses 802. In many examples, the method 100 overcomes these limitations in order to form a dielectric layer with a uniform composition in high-aspect ratio recesses 802.

Figure 9:
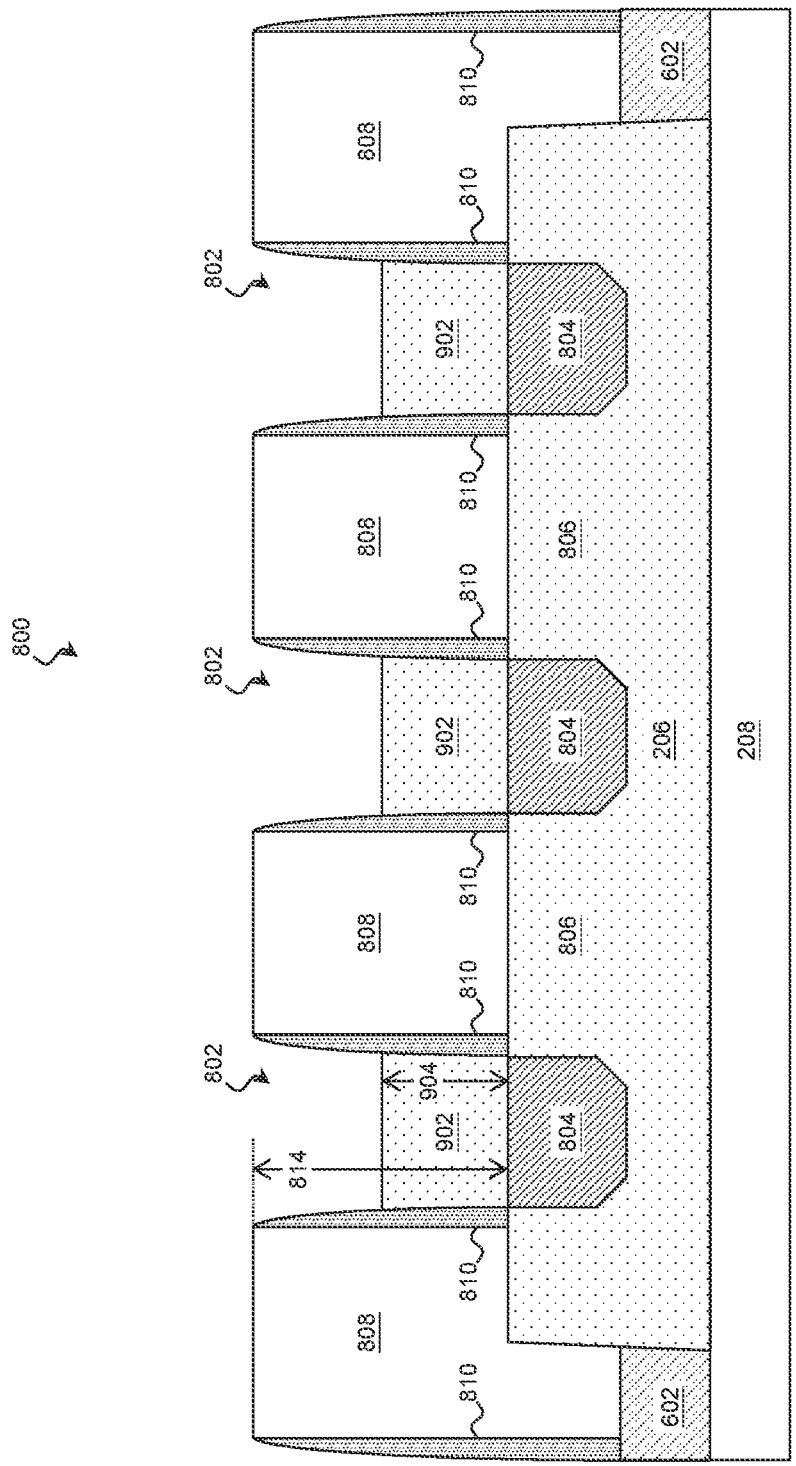

Referring to block 104 of FIG. 1 and to FIG. 9, a first dielectric precursor 902 is deposited on the workpiece 800 in the recess 802. The first dielectric precursor 902 may be substantially similar to the first dielectric precursor 302 above and may interact with a subsequently formed precursor layer to form a dielectric material. Accordingly, the first dielectric precursor 902 may include one or more semiconductor components and one or more non-semiconductor components. In one such embodiment, the first dielectric precursor 902 includes silicon and oxygen, and the ratio of oxygen to silicon in the first dielectric precursor 902 is at least 2:1.

As described above, the first dielectric precursor 902 may be formed using any suitable process including CVD, FCVD, HDP-CVD, PVD, spin-on deposition, and/or other suitable deposition processes. In some examples, the first dielectric precursor 902 is formed by an FCVD process that includes depositing TMOS in a liquid form within the recesses 802 at a temperature between about 50° C. and about 100° C. while supplying $O_3$ and/or another oxygen-radical source to the workpiece 800. The FCVD process may be followed by a curing technique, such as thermal annealing and/or an ultraviolet radiation treatment. The curing technique may include an ozone soak during the curing.

The first dielectric precursor 902 may be formed to any suitable depth 904 within the recesses 802. In some examples where the depth 814 of the recesses 802 is about 60 nm, the first dielectric precursor 902 is formed to a depth 904 of about 30 nm, or about half the depth 814 of the recesses 802. In further examples where the recesses 802 are to be filled using more than two precursor layers, the depth of the first dielectric precursor 902 may be significantly less than half of the depth 814 of the recesses 802 (e.g., about ¼, about ⅛, etc.).

In order to achieve a particular depth 904, in some embodiments, the first dielectric precursor 902 is deposited so that it overfills the recesses 802 and is then etched back to the specified depth 904. The etching process may include a wet etching, a dry etching, and/or other suitable etching technique configured to etch the first dielectric precursor 902 without significantly etching the surrounding materials such as the gate structures 808 and/or the sidewall spacers 810.

Figure 10:
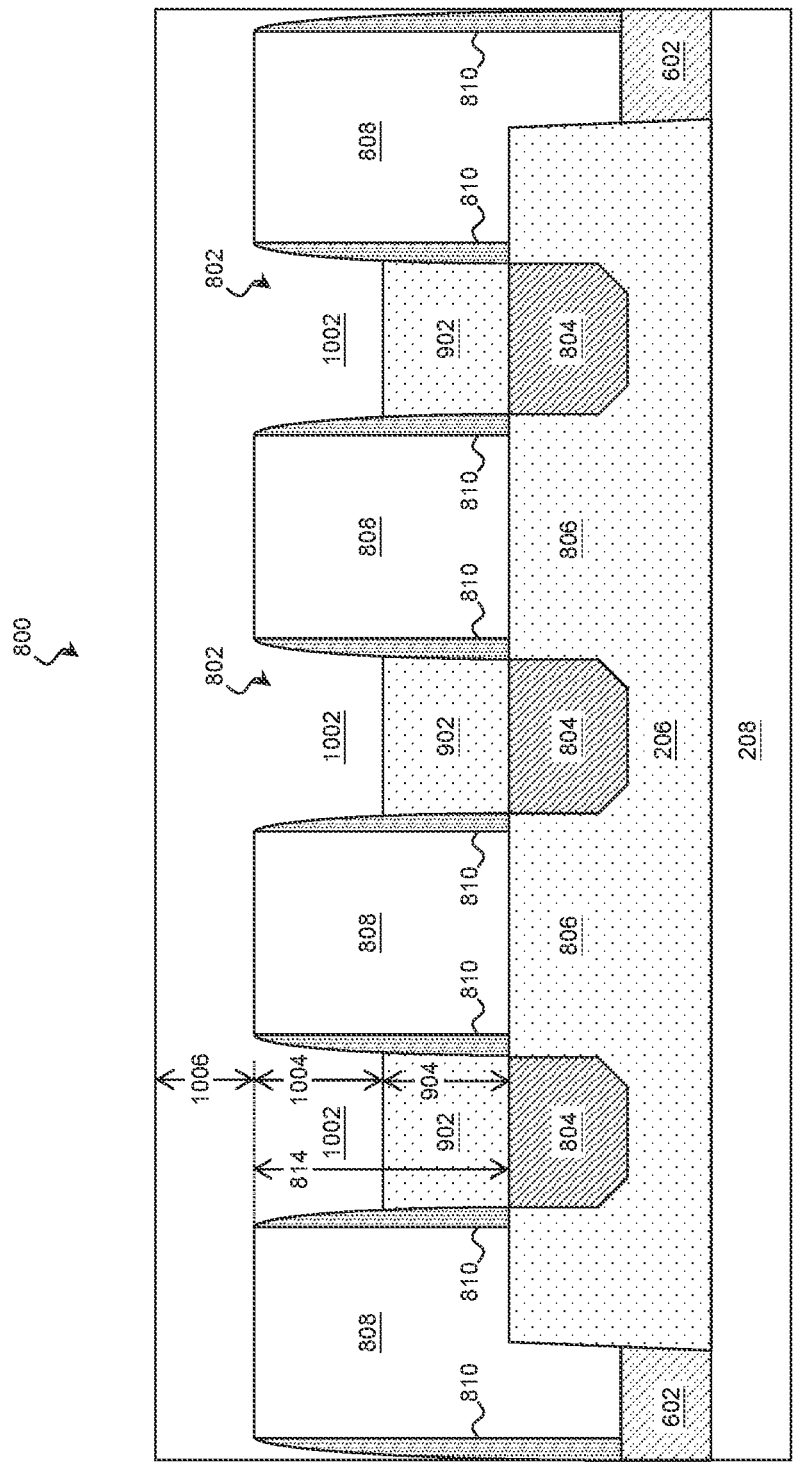

Referring to block 106 of FIG. 1 and to FIG. 10, a second dielectric precursor 1002 is deposited on the workpiece 800 in the recess 802. The second dielectric precursor 1002 may be substantially similar to the second dielectric precursor 402 above and may include the same semiconductor component(s) and non-semiconductor component(s) as the first dielectric precursor 902. The second dielectric precursor 1002 may be semiconductor-rich compared to the first dielectric precursor 902. In one such embodiment, the first dielectric precursor 902 includes silicon and oxygen with a ratio of oxygen to silicon of at least 2:1 at deposition, while the second dielectric precursor 1002 includes silicon and oxygen with a ratio of oxygen to silicon of less than 2:1 at deposition. In a further example, the first dielectric precursor 902 includes silicon and oxygen with a ratio of oxygen to silicon of at least 2:1 at deposition, while the second dielectric precursor 1002 is substantially free of oxygen and instead includes silicon and nitrogen with a ratio of nitrogen to silicon of less than 4:3 at deposition.

As described above, the second dielectric precursor 1002 may be formed using any suitable process including CVD, FCVD, HDP-CVD, PVD, spin-on deposition, and/or other suitable deposition processes. In some examples, the second dielectric precursor 1002 is formed by an FCVD process that includes depositing TSA at a temperature between about 30° C. and about 120° C. while supplying an oxygen-radical source (e.g., $O_3$), $NH_3$, and/or $H_2$ to the workpiece 800. The FCVD process may be followed by a curing technique, such as thermal annealing and/or an ultraviolet radiation treatment. In one such example, the curing includes an ozone soak during curing.

The second dielectric precursor 1002 may be formed to any suitable depth 1004 within the recesses 802 and may extend above the recesses to any suitable height 1006. In some examples where the depth 814 of the recesses 802 is about 60 nm, the second dielectric precursor 1002 is formed to a depth 1004 of about 30 nm, or about half the depth 814 of the recesses 802. In further examples where the recesses 802 are to be filled using more than two precursor layers, the depth of the second dielectric precursor 1002 may be significantly less than half of the depth 814 of the recesses 802 (e.g., about ¼, about ⅛, etc.). Accordingly, blocks 104 and 106 may be repeated any number of times in order to fill the recesses 802 with alternating layers of the first dielectric precursor 902 and the second dielectric precursor 1002.

Figure 11:
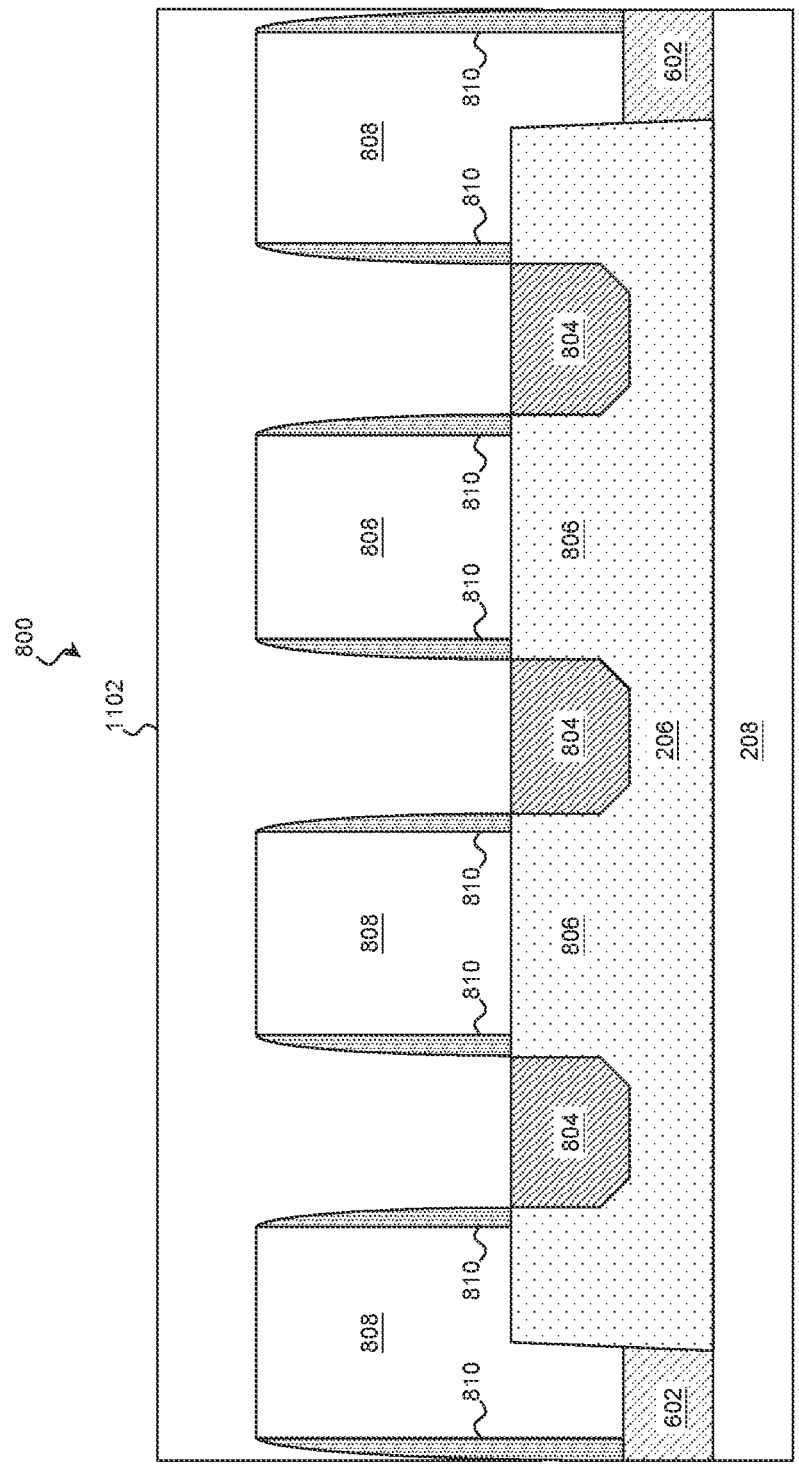

Referring to block 108 of FIG. 1 and to FIG. 11, an annealing process is performed on the workpiece 800. The annealing process causes a portion of at least one of the non-semiconductor materials of the first dielectric precursor 902 to diffuse from the first dielectric precursor 902 into the second dielectric precursor 1002. In this way, the annealing process forms a dielectric layer 1102 from the first dielectric precursor 902 and the second dielectric precursor 1002 that includes a substantially uniform distribution of the semiconductor material(s) and the non-semiconductor material(s) of the precursors.

As described above, the annealing process may utilize any suitable technique, such as Rapid Thermal Annealing (RTA) and/or laser annealing, and may be performed at any suitable temperature for any suitable duration. In some examples, the annealing includes heating the workpiece 800 to a temperature greater than 600° C. for duration between about 1 hour and about 24 hours in a vacuum or in an inert gas environment.

In this way, the technique provides greater uniformity of the distribution of the semiconductor and non-semiconductor materials of the dielectric layer 1102. In some examples, the resulting dielectric layer 1102 has a ratio of the non-semiconductor material(s) to the semiconductor material(s) (e.g., an oxygen to silicon ratio) that varies less than about 5% from the bottom of the recesses 802 to the top. The concentration of oxygen may be greatest at the bottom of the recesses 802 and less at the top of the recesses 802.

Figure 12:
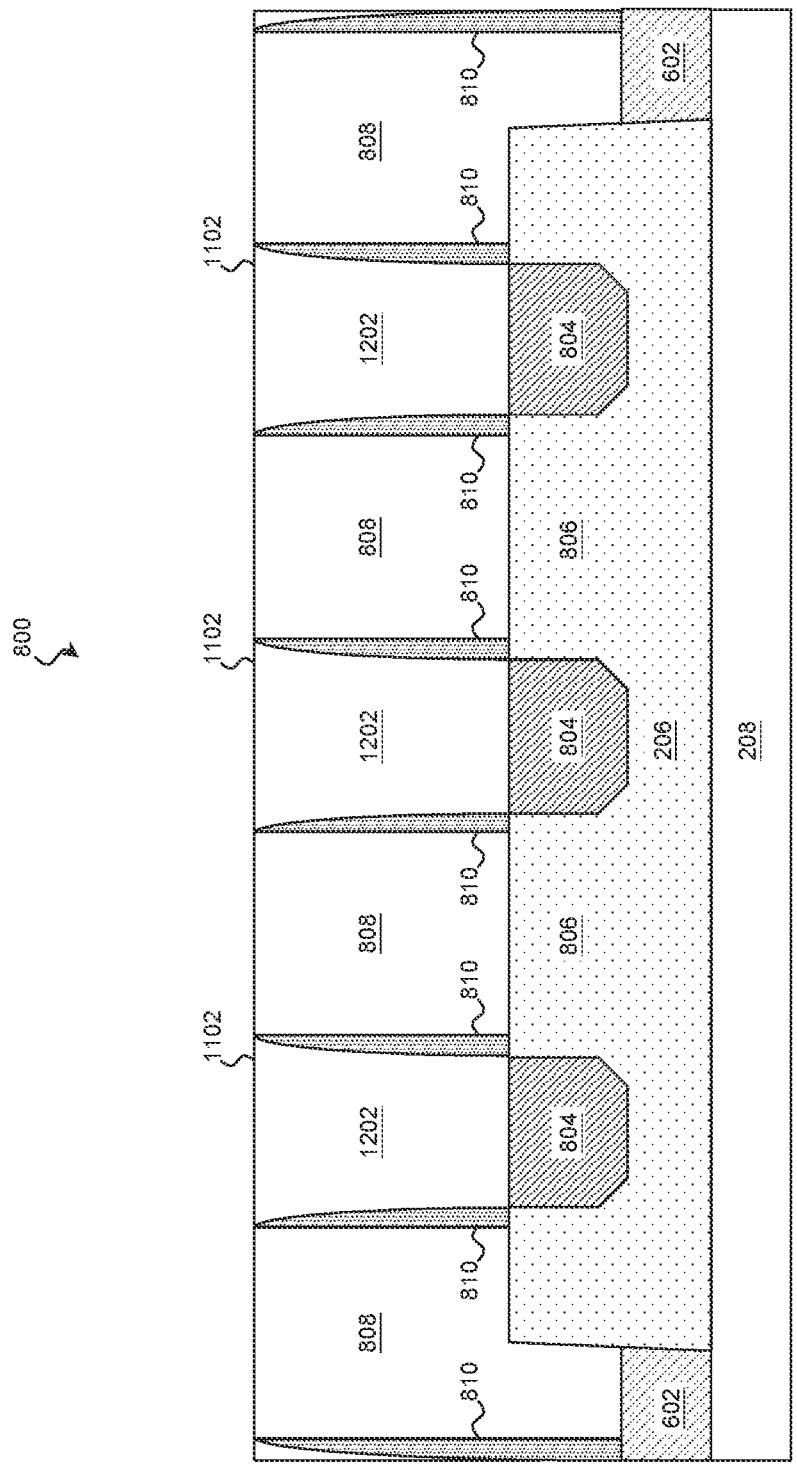

Referring to block 110 of FIG. 1 and to FIG. 12, a Chemical Mechanical Planarization/Polish (CMP) process is performed on the workpiece 800 to remove the portions of the dielectric layer 1102 that extend above the gate structures 808 and/or sidewall spacers 810. The remaining portions of the dielectric layer 1102 form a first ILD 1202 that electrically isolates and supports conductive features, such as source/drain contacts, used to connect the devices of the integrated circuit.

Referring to block 112 of FIG. 1, the workpiece 800 is provided for further fabrication. In various examples this includes: performing a gate replacement process to replace placeholder gates with functional gates, forming a remainder of an electrical interconnect structure, dicing, packaging, and/or other fabrication processes.

Thus, the present disclosure provides examples of a technique for forming a dielectric material of an integrated circuit. In some examples, a method includes receiving an integrated circuit workpiece that includes a recess. A first dielectric precursor is deposited in the recess. The first dielectric precursor includes a non-semiconductor component. A second dielectric precursor is deposited in the recess on the first dielectric precursor, and an annealing process is performed such that a portion of the non-semiconductor component of the first dielectric precursor diffuses into the second dielectric precursor. In some such examples, the non-semiconductor component includes oxygen. In some such examples, a ratio of oxygen to semiconductor of the first dielectric precursor is greater than a ratio of oxygen to semiconductor of the second dielectric precursor prior to the performing of the annealing process. In some such examples, the ratio of oxygen to semiconductor of the first dielectric precursor is greater than 2:1 prior to the performing of the annealing process, and the ratio of oxygen to semiconductor of the second dielectric precursor is less than 2:1 prior to the performing of the annealing process. In some such examples, the performing of the annealing process forms a dielectric layer from the first dielectric precursor and the second dielectric precursor in the recess. A concentration of the non-semiconductor component within the dielectric layer varies less than about 5%. In some such examples, the recess has a depth, and the depositing of the first dielectric precursor is configured such that the first dielectric precursor has a thickness of about half of the depth of the recess. In some such examples, the depositing of the second dielectric precursor is configured such that the second dielectric precursor fills a remainder of the recess. In some such examples, the performing of the annealing process forms a dielectric layer from the first dielectric precursor and the second dielectric precursor, and the dielectric layer forms an isolation feature. In some such examples, the performing of the annealing process forms a dielectric layer from the first dielectric precursor and the second dielectric precursor, and the dielectric layer forms an inter-level dielectric layer.

In further examples, a method includes: receiving a workpiece having a recess, depositing a first flowable dielectric within the recess that includes a semiconductor component and a non-semiconductor component, and depositing a second flowable dielectric on the first flowable dielectric within the recess. The second flowable dielectric has a lower concentration of the non-semiconductor component than the first flowable dielectric. An annealing process is performed on the workpiece such that the non-semiconductor component migrates from the first flowable dielectric to the second flowable dielectric. In some such examples, the annealing process is performed in one of a vacuum or an inert gas environment. In some such examples, the non-semiconductor component includes oxygen. In some such examples, a ratio of oxygen to semiconductor of the first flowable dielectric is greater than 2:1 prior to the performing of the annealing process, and a ratio of oxygen to semiconductor of the second flowable dielectric is less than 2:1 prior to the performing of the annealing process. In some such examples, the depositing of the first flowable dielectric includes a first flowable chemical vapor deposition process. In some such examples, the depositing of the second flowable dielectric includes a second flowable chemical vapor deposition process.

In yet further examples, a method includes receiving a workpiece that includes a recess having a bottom surface and opposing side surfaces. A first dielectric precursor is deposited on the bottom surface of the recess, and a second dielectric precursor is deposited within the recess and on the first dielectric precursor. The workpiece is annealed to diffuse a non-semiconductor material from the first dielectric precursor to the second dielectric precursor. In some such examples, the depositing of the first dielectric precursor includes depositing tetramethyl orthosilicate. In some such examples, the depositing of the second dielectric precursor includes depositing trisilylamine. In some such examples, the annealing is performed in one of a vacuum or an inert gas environment. In some such examples, the opposing side surfaces are side surfaces of device fins extending from a substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece that includes a recess defined between two gate structures;
   depositing a first dielectric precursor in the recess using flowable chemical vapor deposition (FCVD);
   after the depositing of the first dielectric precursor, depositing a second dielectric precursor in the recess to directly contact top surfaces of the two gate structures, the second dielectric precursor comprising silicon and oxygen;
   after the depositing of the second dielectric precursor, curing the second dielectric precursor using an ozone soak process;
   after the curing of the second dielectric precursor, performing an annealing process such that oxygen in the first dielectric precursor diffuses into the second dielectric precursor to form a dielectric layer; and
   after the annealing process, planarizing the workpiece to expose the top surfaces of the two gate structures,
   wherein the depositing of the second dielectric precursor comprises depositing trisilylamine (TSA) using FCVD while supplying an oxygen-radical source, ammonia ($NH_3$) or hydrogen ($H_2$).

2. The method of claim 1, wherein the two gate structures comprise polysilicon, and wherein the second dielectric precursor comprises silicon and nitrogen.

3. The method of claim 1, wherein the first dielectric precursor comprises a first ratio of oxygen to silicon, wherein the second dielectric precursor comprises a second ratio of oxygen to silicon, the second ratio being less than the first ratio.

4. The method of claim 1, further comprising:
   before the depositing of the second dielectric precursor, etching back the first dielectric precursor in the recess.

5. The method of claim 4,
   wherein the two gate structures comprise a gate height,
   wherein the etching back terminates when a thickness of the first dielectric precursor is about one half of the gate height.

6. The method of claim 1,
   wherein the workpiece comprises a semiconductor fin including a source/drain feature exposed in the recess,
   wherein the two gate structures are disposed over channel regions of the semiconductor fin, the channel regions being adjacent to the source/drain feature.

7. The method of claim 1,
   wherein the workpiece further comprises sidewall spacers disposed along sidewalls of the two gate structures,
   wherein the first dielectric precursor and the dielectric layer are spaced apart from the two gate structures by the sidewall spacers.

8. The method of claim 1, wherein the annealing process comprises a rapid thermal annealing.

9. The method of claim 1, wherein the annealing process comprises an annealing temperature greater than 600° C.

10. The method of claim 1, further comprising:
    after the planarizing, replacing the two gate structures with two functional gate structures.

11. A method, comprising:
    providing a workpiece that includes:
    a substrate,
    a fin structure disposed on the substrate, the fin structure comprising a first channel region, a second channel region, and a source/drain region disposed between the first channel region and the second channel region,
a source/drain feature disposed over the source/drain region,
a first placeholder gate disposed over the first channel region, and
a second placeholder gate disposed over the second channel region;
forming a first dielectric precursor layer in a recess defined between the first placeholder gate and the second placeholder gate such that a top surface of the first dielectric precursor layer is lower than top surfaces of the first placeholder gate and the second placeholder gate;
after the forming of the first dielectric precursor layer, depositing a second dielectric precursor layer in the recess and over the first placeholder gate and the second placeholder gate, the second dielectric precursor layer comprising oxygen;
after the depositing of the second dielectric precursor layer, curing the second dielectric precursor layer using an ozone soak process; and
after the curing of the second dielectric precursor layer, performing an annealing process such that oxygen in the first dielectric precursor layer diffuses into the second dielectric precursor layer to form a dielectric layer,
wherein the forming of the second dielectric precursor layer comprises depositing trisilylamine (TSA) using flowable chemical vapor deposition (FCVD) while supplying an oxygen-radical source, ammonia ($NH_3$) or hydrogen ($H_2$).

12. The method of claim 11, wherein the forming of the first dielectric precursor layer comprises:
depositing a first dielectric precursor using FCVD; and
etching back the deposited first dielectric precursor to form the first dielectric precursor layer,
wherein the etching back is performed such that a topmost surface of the first dielectric precursor layer is lower than a topmost surface of the first placeholder gate.

13. The method of claim 11,
wherein the workpiece further comprises a first sidewall spacer disposed on a sidewall of the first placeholder gate and a second sidewall spacer disposed on a sidewall of the second placeholder gate.

14. The method of claim 13,
wherein the first dielectric precursor layer is spaced apart from the first placeholder gate by the first sidewall spacer,
wherein the first dielectric precursor layer is spaced apart from the second placeholder gate by the second sidewall spacer.

15. The method of claim 13,
wherein the first sidewall spacer and the second sidewall spacer comprise semiconductor oxide, a semiconductor nitride, a semiconductor oxynitride, or a semiconductor carbide.

16. The method of claim 11, wherein the first dielectric precursor layer comprises a first ratio of oxygen to silicon, wherein the second dielectric precursor layer comprises a second ratio of oxygen to silicon, wherein the second ratio is less than the first ratio, wherein the second dielectric precursor layer further comprises nitrogen.

17. A method, comprising:
providing a workpiece that includes:
a substrate,
an active region disposed on the substrate, the active region comprising a first channel region, a second channel region, and a source/drain region disposed between the first channel region and the second channel region,
a source/drain feature disposed over the source/drain region,
a first polysilicon gate disposed over the first channel region, and
a second polysilicon gate disposed over the second channel region;
forming a first dielectric precursor layer in a recess defined between the first polysilicon gate and the second polysilicon gate such that the first dielectric precursor layer is deposited on the source/drain feature;
curing the first dielectric precursor layer using a first annealing process;
after the curing of the first dielectric precursor layer, depositing a second dielectric precursor layer in the recess, over the first dielectric precursor layer and over a top surface of the first polysilicon gate and a top surface of the second polysilicon gate such that the second dielectric precursor layer is in direct contact with both the top surface of the first polysilicon gate and the top surface of the second polysilicon gate, the second dielectric precursor layer comprising oxygen;
after the depositing of the second dielectric precursor layer, curing the second dielectric precursor layer using a second annealing process;
after the curing of the second dielectric precursor layer, performing a third annealing process to form a dielectric layer from the first dielectric precursor layer and the second dielectric precursor layer; and
after the third annealing process, planarizing the workpiece such that top surfaces of the dielectric layer, the first polysilicon gate and the second polysilicon gate are coplanar,
wherein the depositing of the second dielectric precursor layer comprises depositing trisilylamine (TSA) using flowable chemical vapor deposition (FCVD) while supplying an oxygen-radical source, ammonia ($NH_3$) or hydrogen ($H_2$).

18. The method of claim 17, further comprising:
replacing the first polysilicon gate and the second polysilicon gate with a first functional gate and a second function gate, respectively.

19. The method of claim 17, wherein the first dielectric precursor layer comprises a first ratio of oxygen to silicon, wherein the second dielectric precursor layer comprises a second ratio of oxygen to silicon, wherein the first ratio is greater than the second ratio.

20. The method of claim 17, wherein the forming of the first dielectric precursor layer comprises:
depositing a first dielectric precursor over the recess using FCVD; and
etching back the deposited first dielectric precursor to form the first dielectric precursor layer,
wherein the etching back is performed such that a topmost surface of the first dielectric precursor layer is lower than a topmost surface of the first polysilicon gate.

* * * * *